US005446322A

United States Patent [19]
Reynolds

[11] Patent Number: 5,446,322
[45] Date of Patent: Aug. 29, 1995

[54] APPARATUS AND METHOD FOR DETERMINING WHEN THE FREQUENCY OF AN ALTERNATING SIGNAL IS BELOW A PREDETERMINED THRESHOLD

[75] Inventor: David C. Reynolds, Georgetown, Mass.

[73] Assignee: Analog Devices, Inc., Norwood, Mass.

[21] Appl. No.: 876,756

[22] Filed: May 1, 1992

[51] Int. Cl.$^6$ .............................................. H03K 9/06
[52] U.S. Cl. ....................................... 327/44; 327/33; 327/37
[58] Field of Search .................. 307/234, 522, 523; 328/140, 136, 138; 323/313, 314, 907, 315, 316

[56] References Cited

U.S. PATENT DOCUMENTS

| | | | |
|---|---|---|---|
| 3,940,760 | 2/1976 | Brokaw | 307/296.6 |
| 4,222,095 | 9/1980 | Stein | 328/234 |
| 4,746,820 | 5/1988 | Fey | 328/138 |
| 4,799,024 | 1/1989 | Fischer | 307/234 |
| 4,890,248 | 12/1989 | Reinhardt | 307/523 |
| 5,059,890 | 10/1991 | Yoshikawa et al. | 323/315 |
| 5,126,653 | 6/1992 | Ganesan et al. | 323/313 |

Primary Examiner—Timothy P. Callahan
Assistant Examiner—Toan Tran
Attorney, Agent, or Firm—Parmelee, Bollinger & Bramblett

[57] ABSTRACT

A frequency-responsive integrated circuit (IC) for determining when the frequency of a clock pulse input signal is below a predetermined threshold level, the IC including a capacitor charged up at a nearly constant rate by a current source. If the capacitor voltage reaches one-third of the DC power voltage, and input pulses are received, the capacitor is discharged to start another charge-up cycle. If no input pulses were received, the capacitor continues to charge up until its voltage reaches two-thirds of the DC power voltage, at which point an output signal is produced indicating that the input frequency is below the predetermined threshold level.

15 Claims, 1 Drawing Sheet

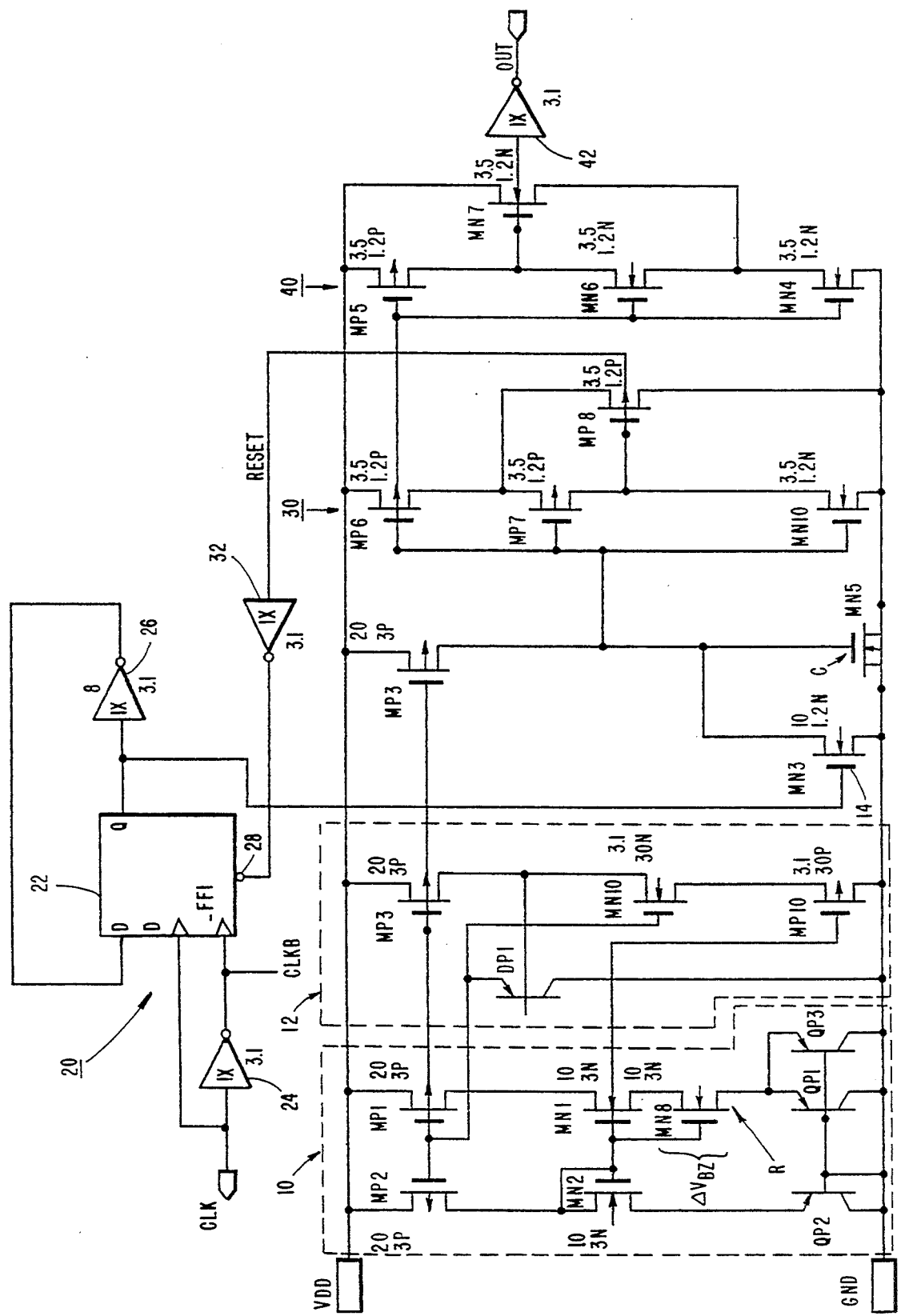

APPARATUS AND METHOD FOR DETERMINING WHEN THE FREQUENCY OF AN ALTERNATING SIGNAL IS BELOW A PREDETERMINED THRESHOLD

BACKGROUND OF THE INVENTION

1. Field of the Invention

This invention relates to frequency-responsive circuitry. More particularly, this invention relates to such circuitry for determining when the frequency of an alternating signal, such as a clock signal, is below a predetermined level.

2. Description of the Prior Art

Lap top computers can be powered either with internal battery, i.e., when operating in stand-alone mode with the on-board black-and-white, low-power display device they carry, such as a liquid crystal display (LCD), or can be plugged into line power for operation with an auxiliary higher-power-consumption three-color display monitor providing a superior presentation of data but requiring control circuitry which consumes power at a rate which would quickly exhaust an on-board battery.

When in battery-powered mode, much of the display control circuitry of the computer is not needed for the relatively simpler black-and-white display, and those portions of the computer circuitry can be powered-down in that mode in order to conserve battery power. The computer advantageously is provided with automatic means for turning off such power-consuming circuitry as is not needed when operating with the battery-powered black-and-white display.

Some three-color monitor displays may require a clock frequency of from about 25 to 40 MHz. System considerations, such as testing, may dictate the use of much lower clock frequencies when operating on a-c line power, and a limit of 200 kHz might for example be selected as the lower threshold for line-power operation. When operating with battery power for the on-board black-and-white display, the clock frequency of the color display circuitry is set to be much lower, or even at zero, because of the relative simplicity of the on-board display. Control means responsive to clock frequency thus can be used to determine when the computer is being operated on battery power. Following such determination, the control means will automatically turn off the unneeded circuits. To be commercially practical, such control means must be highly reliable in operation, yet relatively inexpensive to make.

SUMMARY OF THE INVENTION

In a preferred embodiment of the invention, to be described in detail hereinbelow, there is provided a frequency-responsive integrated circuit (IC) which receives the computer clock signal and produces an output signal whenever the clock frequency is below a threshold value such as 200 kHz. This circuit basically comprises a capacitor charged at a nearly constant rate by a current source, and discharged at selected times when certain conditions are met.

As the capacitor charges up, its voltage is sensed by a first comparator which detects when the voltage reaches a relatively low preset trip-point level such as one-third of the DC supply voltage ($V_{DD}$). If the computer is operating on line power to activate an auxiliary monitor display, its clock frequency will be high (e.g., between 200 kHz and 40 MHz). This high frequency is indicated by the receipt of clock pulses prior to the time the capacitor voltage reaches the low preset comparator reference level, and the appearance of such clock pulses will be detected and the capacitor discharged at the comparator trip point to start another charge-up timing cycle. Since the computer is being supplied with external line power for the auxiliary monitor display, the full complement of display control circuitry will be needed and will be powered.

If the computer is shifted to battery power, the clock frequency drops to a very low value, or zero, since the on-board display does not need high-frequency operation. Now, as the capacitor charges up, no clock pulses will have been received prior to the time its voltage reaches the trip point of the first comparator. That is, the low clock frequency results in a time interval between clock pulses which is substantially longer than the time required for the capacitor voltage to reach the comparator trip point (which may for example be about 20 $\mu$sec). Thus the capacitor continues to charge up beyond that trip point.

As the capacitor continues to charge up beyond that trip point, a second comparator senses its voltage. This comparator detects when the voltage reaches a higher preset voltage (e.g., two-thirds of $V_{DD}$) without any clock pulses having been received since the start of capacitor charging. This absence of clock pulses indicates a low-frequency clock rate. Upon detecting that condition, the second comparator produces an output signal to indicate that the computer is operating on battery power. That output signal causes power-down of certain components of the display control circuitry, to conserve battery power.

The frequency-responsive IC described herein incorporates a number of important features to assure that its operation is reliable notwithstanding uncontrolled conditions such as changes in $V_{DD}$ or process variations in manufacturing the IC. Such reliable operation is particularly important to assure that the IC does not indicate falsely that the clock frequency is below the selected threshold level and switch the display-control circuitry off. In that regard, features of the invention provide a considerable dynamic range of operation with assured performance. Other objects, aspects and advantages of the invention will be pointed out in, or apparent from, the following description of a preferred embodiment considered together with the accompanying drawing which shows a circuit diagram of the new integrated circuit.

BRIEF DESCRIPTION OF THE DRAWINGS

FIG. 1 is a circuit diagram of an integrated circuit embodying the present invention.

DESCRIPTION OF PREFERRED EMBODIMENT

Referring now to FIG. 1, the frequency-responsive IC comprises a charging capacitor C which is an MOS device (MN5) with source and drain connected to ground for one capacitor terminal, and the gate serving as the other capacitor terminal. Current is directed to the gate of MN5 by a current source MP3 connected to the positive power line $V_{DD}$. The capacitor charging current is compensated for changes in $V_{DD}$ by a band-gap regulator circuit generally indicated at 10, and provided with a start-up circuit generally indicated at 12. Detailed information on band-gap regulators may be found in many prior art publications, such as U.S. Pat. Nos. 3,940,760 and 4,622,512, issued to A. P. Brokaw.

The band-gap circuit 10 includes two bipolar transistors QP2 and QP1/QP3, providing a 2:1 emitter area ratio. The transistor emitter currents are directed to current mirrors MN1, MN2 and MP1, MP2, which force the transistor currents to be equal. With unequal emitter areas, a $\Delta V_{BE}$ voltage is developed between the emitters. This $\Delta V_{BE}$ voltage appears across the resistor R formed by an MOS transistor MN8, and develops a corresponding current $\Delta V_{BE}/R$ through the bipolar transistors. This current is mirrored to the current source MP3 supplying charging current to the MOS capacitor C. Changes in $V_{DD}$ have very little effect on the magnitude of this charging current, because the $\Delta V_{BE}$ voltage is essentially proportional only to the variable of absolute temperature.

This capacitor charging arrangement also provides compensation for the usual variations in the manufacturing process which result in differences between successive lots of IC chips. For example, if process variations cause a reduced thickness of oxide beneath the gate of MN5, there would be an increase in the capacitance C tending to decrease the rate-of-change of the capacitor voltage ramp-up. However, that same reduced thickness of oxide would occur also for MN8 thereby reducing the resistance R and increasing the charging current into the capacitor. Thus, there is automatic compensation for at least part of the increase in capacitance. In that way, the rate-of-change of the capacitor voltage advantageously is maintained very nearly constant.

As noted above, the current through resistor R is proportional to $\Delta V_{BE}$, and thus is proportional to absolute temperature. However, as the temperature increases, the resistance of R also increases, thus tending to maintain the charging current into capacitor C constant in the face of temperature changes.

After the capacitor C is charged up to a preset level, it is discharged back to zero volts under certain conditions as described below, and the capacitor charging cycle begins again. Discharge of the capacitor is effected by an MOS transistor 14 (MN3) acting as a switch connected directly across the capacitor. This switch is controlled by a timing control circuit generally indicated at 20 and now to be described.

The timing control circuit 20 includes an input terminal CLK which receives the clock signal whose frequency is to be sensed. This CLK terminal is connected to one input of a D-type flip/flop 22 and, through an inverter 24, to the other flip-flop input to provide a differential input signal. The output Q of the flip/flop is fed back through an inverter 26 to the D input, thereby forming a toggle flip-flop. In that configuration, each input clock pulse reverses the state of the flip-flop unless the signal to the reset terminal 28 disables the flip-flop, as will be further described.

When the flip-flop is toggled by a series of input clock pulses, it acts as a 2:1 frequency divider, and produces output pulses having an effective duty-cycle of 50% regardless of the duty-cycle of the stream of clock pulses. Thus, the constraints of prior art circuits on clock pulse duty-cycle are avoided by this toggle flip-flop arrangement.

If high-frequency clock pulses (e.g., at 40 MHz) are applied to the CLK terminal, and if the flip-flop 22 turned on the switch MN3 to discharge the capacitor for each clock-pulse cycle, there would be significant current flow through the gate-to-drain capacitance (Cgd) of MN3 as a result of the considerable voltage activity at the gate. This current flow could be of the same order of magnitude as the charging current from MP3, and thus could significantly alter the capacitor charging rate and interfere with the desired timing function to be provided by that capacitor. The timing control circuit 20, however, is provided with means to prevent this adverse result, as will now be described.

Initially, as the capacitor C begins to charge up, the Q output of the flip-flop 22 is forced to logic zero by a signal on its reset terminal 28 which also disables the flip-flop. Thus, if a high-frequency (e.g., 40 MHz) stream of clock pulses is applied to the CLK terminal, the flip-flop will (initially) not change state to turn on the switch MN3 for each clock pulse received. Thus the capacitor will charge up steadily and at a fixed rate while a relatively large number of high-frequency clock pulses is received, for example, a hundred or so pulses. This disabling of the flip-flop prevents the voltage swing activity which otherwise would occur at the gate of MN3 during ramp-up of the capacitor voltage, thereby minimizing the flow of parasitic transient or a-c current into the capacitor C and assuring smooth and steady ramp-up of its voltage.

As the voltage on the charging capacitor C ramps up, it is sensed by a first comparator 30 comprising a string of three series-connected MOS transistors MP5, MP7 and MN10, and one additional transistor MP8, with current supplied by $V_{DD}$. These transistors are scaled in such a way that the comparator trips when the capacitor voltage reaches a relatively low-level reference voltage, e.g., about one-third $V_{DD}$. The resulting comparator output is passed through an inverter 32 to the reset terminal 28 of the flip-flop 22 and enables that flip-flop so that upon receipt of the next clock pulse the flip-flop switches state and turns on MN3 to discharge the capacitor C.

If the stream of clock pulses on the CLK terminal is at a relatively low frequency, such as 10 kHz, the time between pulses will be sufficiently long that the capacitor C will be able to charge up to beyond the trip point of the first comparator 30 without being discharged back to zero by MN3. Ultimately, however, the capacitor voltage will reach the trip point of a second comparator 40 which comprises a second set of three series-connected transistors MP5, MN6 and MN4, and an additional transistor MN7. These transistors are so scaled that the comparator trip point is at a relatively higher voltage than that of the first comparator 30, preferably about two-thirds of $V_{DD}$.

When the second comparator trips, its signal passes through an inverter 42 to an output terminal OUT. This output signal indicates that the received clock pulses are at a frequency below a predetermined threshold (such as 200 kHz). The computer thus is indicated to be on battery power, and the output signal accordingly effects switchover (by conventional means not shown) to the power-down mode where selected portions of the computer circuitry are turned off to conserve battery power.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein. For example, the invention may be provided as a cell in an IC chip containing other circuitry, or it may be provided as a separate chip. Still other variations are readily possible as is known in the art, including different circuit arrangements for achieving the basic purposes of the invention as set forth in the accompanying claims.

What is claimed is:

1. Frequency-responsive means for receiving an alternating input signal and producing an output signal indicating when the frequency of the input signal is below a predetermined level;

said frequency-responsive means comprising an integrated circuit formed by a process for making a plurality of MOS transistor means with the integrated circuit including:

first MOS transistor means arranged to establish a capacitor;

means for producing a charging current for said MOS capacitor;

said charging current means including second MOS transistor means including at least one MOS transistor serving as a resistor, said charging current means being arranged to produce said charging current at a level inversely proportional to the value of said resistor, control means to receive said alternating input signal and coupled to said capacitor to control the discharge thereof in accordance with the frequency of said alternating input signal;

said one MOS transistor forming part of a band-gap regulator circuit;

said band-gap regulator circuit further including a pair of bipolar transistors driven with different current densities so as to produce differing $V_{BE}$ voltages for each;

circuit means connecting said one MOS transistor to said bipolar transistors to produce a $\Delta V_{BE}$ voltage across the resistor defined by said one transistor; and means for producing said output signal when said capacitor is charged by said current to a pre-set voltage level.

2. Apparatus as claimed in claim 1, including current mirror means connected to receive said current flowing through said one MOS transistor;

said current mirror means further including a current source to produce said charging current proportional to the current through said one MOS transistor.

3. Frequency-responsive integrated circuit means for receiving an alternating input signal and producing an output signal indicating when the frequency of the input signal is below a predetermined level;

said integrated circuit means comprising:

first MOS transistor means connected to establish a capacitor;

means for producing a charging current for said MOS capacitor;

means responsive to said alternating input signal and to the voltage on said capacitor and operable, when said capacitor has been charged to a first pre-set voltage and signal alternations of said input signal are received, to produce a control pulse;

switch means having a control terminal responsive to said control pulse for discharging said capacitor; and means for producing said output signal when said capacitor is charged by said current to a second pre-set voltage level higher than said first level.

4. Apparatus as claimed in claim 3, wherein said responsive means comprises frequency-divider means including a toggle flip-flop the output of which is coupled to said control terminal of said switch means.

5. Apparatus as claimed in claim 4, including first comparator means responsive to the voltage on said capacitor and operable to produce an output signal for disabling said toggle flip-flop until the capacitor voltage has reached said first pre-set voltage level.

6. Apparatus as claimed in claim 5, wherein said means for producing said output signal comprises second comparator means operable when said capacitor voltage reaches said second pre-set voltage.

7. Frequency-responsive integrated circuit means for receiving an alternating input signal and producing an output signal indicating when the frequency of the input signal is below a predetermined level;

said integrated circuit means comprising:

first MOS transistor means connected to establish a capacitor;

means for producing a charging current for said MOS capacitor;

means for discharging said capacitor when its voltage reaches a first pre-set level and an alternating input signal has been received by said means for discharging said capacitor; and means coupled to said capacitor for producing said output signal when said capacitor has been charged by said current to a second pre-set voltage level higher than said first pre-set level.

8. Apparatus as claimed in claim 7, wherein said means for discharging said capacitor includes control means responsive to said alternating input signal and operable to produce a control pulse;

switch means having a control terminal and operable upon receiving said control pulse to discharge said capacitor; and means responsive to the capacitor voltage for disabling said control means until the capacitor voltage reaches said first pre-set level.

9. Apparatus as claimed in claim 8, wherein said control means comprises a toggle flip-flop the output of which is coupled to said control terminal of said switch means.

10. Apparatus as claimed in claim 9, said means for disabling said control means including first comparator means responsive to the voltage on said capacitor and operable to produce a signal for disabling said toggle flip-flop until the capacitor voltage has reached said first pre-set voltage level.

11. Apparatus as claimed in claim 10, wherein said means for producing said output signal comprises second comparator means operable when said capacitor voltage reaches said second pre-set voltage.

12. The method of monitoring a clock pulse signal to determine when its frequency is below a predetermined level, comprising:

charging a capacitor formed by MOS transistor means;

sensing the capacitor voltage to determine when it reaches a first pre-set level;

discharging said capacitor after its voltage reaches said first pre-set level and a clock pulse is received;

sensing the capacitor voltage to determine when it reaches a second pre-set voltage larger than said first pre-set voltage; and producing an output signal when said second pre-set voltage is reached without a clock pulse having been received.

13. The method of claim 12, wherein the capacitor is discharged by MOS switch means;

directing said clock pulses to a control circuit for producing corresponding control pulses; and preventing any control pulse from reaching said MOS switch means until the capacitor voltage reaches said first pre-set voltage level.

14. Apparatus as claimed in claim 1, wherein said charging current means includes a source of constant voltage applied across said MOS resistor to produce a corresponding flow of current therethrough.

15. Frequency-responsive means for receiving an alternating input signal and producing an output signal indicating when the frequency of the input signal is below a predetermined level;

said frequency-responsive means comprising an integrated circuit formed by a process for making a plurality of MOS transistor means with the integrated circuit including:

first MOS transistor means arranged to establish a capacitor;

means for producing a charging current for said MOS capacitor;

said charging current means including a band-gap regulating circuit having a pair of bipolar transistors driven with different current densities so as to develop a $\Delta V_{BE}$ voltage, said charging current means further including a resistor developing said $\Delta V_{BE}$ voltage thereacross;

current mirror means developing current proportional to that through said resistor;

said current mirror means further comprising a current source tracking the current through said resistor and serving as the charging current for said capacitor;

means responsive to said alternating input signal and coupled to said capacitor to control the discharge thereof in accordance with the frequency of said alternating input signal;

said responsive means including an MOS switch connected across said MOS capacitor;

power supply means producing a DC power supply voltage;

means for producing said output signal when said capacitor is charged by the current from said current source to a particular voltage level close to the DC power supply voltage;

said responsive means further comprising a timing control circuit responsive to said alternating input signal and operable to activate said MOS switch under selected conditions to provide for a further charging cycle;

said MOS switch being activated when the voltage on said MOS capacitor reaches a first pre-set level and at least one alternating signal has been received by said means responsive to said alternating input signal;

said timing control circuit including a flip-flop circuit having a reset terminal; and a comparator responsive to said capacitor voltage and operable to control the signal on said reset terminal so as to disable said flip-flop until the capacitor voltage reaches said first pre-set level;

said first pre-set level being lower than said particular voltage level.

* * * * *